(12) United States Patent
Lozes et al.

(10) Patent No.: US 6,436,607 B1
(45) Date of Patent: Aug. 20, 2002

(54) BORDER MODIFICATION FOR PROXIMITY EFFECT CORRECTION IN LITHOGRAPHY

(75) Inventors: Richard L. Lozes, Pleasanton, CA (US); Andrew Muray, Portland, OR (US); Allen M. Carroll, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/517,612

(22) Filed: Mar. 2, 2000

(51) Int. Cl.[7] .................................................. G03C 5/00
(52) U.S. Cl. .................................... 430/296; 250/492.22
(58) Field of Search ...................... 430/296; 250/492.22, 250/492.3

(56) References Cited

U.S. PATENT DOCUMENTS 4,520,269 A * 5/1985 Jones ....................... 250/492.2
4,957,835 A * 9/1990 Aden ............................ 430/5

* cited by examiner

*Primary Examiner*—Rosemary Ashton
(74) *Attorney, Agent, or Firm*—Jung-hua Kuo

(57) ABSTRACT

Dose conservation is used during pattern modification in the data preparation phase of scanning beam lithography. The features to be exposed on a substrate, such as a mask or direct written semiconductor wafer, are corrected while neighboring features suffer little or no change. Thus, the edge of a feature is moved in terms of its exposure location without appreciably affecting the scattering into its neighbors. This achieves a developed feature which meets the intended design edge location. This process also corrects for variations in resist profile angles which otherwise may vary depending upon localized feature packing density. Not only is the feature edge moved but its dose per area is adjusted while conserving total dose over the feature.

16 Claims, 5 Drawing Sheets

BORDER MODIFICATION FOR PROXIMITY EFFECT CORRECTION IN LITHOGRAPHY

FIELD OF THE DISCLOSURE

This disclosure relates to lithography and more specifically to beam lithography, for instance electron beam or laser pattern generator lithography, and more particularly to proximity effect correction for such lithography.

DESCRIPTION OF THE RELATED ART

Lithography is a well-known field, especially as used in the semiconductor industry for fabricating both integrated circuits and the masks used in optical stepper lithography to fabricate integrated circuits. Beam lithography involves directing a modulated beam of radiation such as electron beams or laser light onto a sensitive resist which coats a substrate. The substrate is, e.g., a mask blank or semiconductor wafer. Only portions of the resist are exposed by the beam. The resist is then developed and the exposed portions (or the nonexposed portions) are removed depending on the type of resist. Subsequently, the patterned resist is used for etching of the underlying material or growth, for instance, of oxides.

Typically in beam lithography, such as electron beam lithography or laser pattern generator lithography, the beam is modulated and scanned across the surface of the workpiece (wafer or mask blank). The scanning defines two-dimensional features which have particular shapes. Typically, the pattern being imaged is partitioned into a number of such features by pattern generation software and/or hardware which is a portion of the lithography tool.

A process called proximity effect correction is well known in such beam lithography. This especially applies to the field of electron beam lithography but is not so limited. When a resist layer is exposed by an electron beam, the feature edges do not develop exactly as exposed due to electron scattering in the resist and underlying substrate. Particularly, an edge of a feature in close proximity to an edge of another feature is moved after development compared to its nominal (intended) location due to this proximity effect more than is an isolated feature edge. Clearly, this results in undesired distortions (errors) in the resulting developed pattern. It would be highly advantageous to reduce such differences to a constant regardless of the proximity of a feature edge to an adjacent feature.

This problem is illustrated in FIGS. 1a and 1b. FIG. 1a shows graphically exposure of a feature. The horizontal axis is distance x in microns ($\mu$m). The vertical axis is the exposure level of the feature (in arbitrary units). The exposure pattern in this case includes the nominal region which is the main portion of the feature and a "prebias" edge region as shown. A corresponding energy density profile in FIG. 1b shows the problematic tail which is the dark area to the right of the curve ("Prebias+Nominal") causing the influence on an adjacent feature due to the proximity effect. The problem is that the height of this tail varies. Desirably, the height of the tail should be constant throughout the imaged area. Prior art proximity effect correction techniques, such as the "GHOST" technique, do accomplish this. See U.S. Pat. No. 4,463,265 issued Jul. 31, 1984 to Owen et al., incorporated by reference in its entirety, for description of the "GHOST" technique which is one type of proximity effect correction. The GHOST technique arranges the exposure such that there is a uniform background. However, the GHOST technique has the drawback that the modulation of the exposure density is reduced compared to the uncorrected case. This results in a reduced process window and therefore reduced yield due to statistical fluctuations in dose, resist properties, and other process parameters.

Another closely related problem is that of resist profile angle. This is shown in FIG. 1c which is a side view of a substrate S on which is a patterned resist region R. As seen, the left hand side of the resist region R is at angle $\theta$ to the principal surface of the substrate S. Nominally and ideally, angle $\theta$ is 90 degrees as indicated by the dotted line. That is, the resist edges are preferably vertical. Such vertical resist edges are relatively easily achieved in conventional optical mask (stepper) lithography. It is much more difficult in beam lithography of the type described herein to obtain such a 90 degree angle or even close to it due to scattering effects.

Moreover, the resist profile angles $\theta$ may vary on any one workpiece as shown. Without explicit control, the resist profile angle $\theta$ from beam lithography varies with feature size and packing density (proximity) even on any one workpiece. It would be desirable to control this resist profile angle of each feature edge to be within a user-specifiable tolerance so that, at a minimum, all feature edges have the same resist profile angle. The reason that variation in resist profile angle is undesirable is that the subsequent processing steps, which typically include etching or material growth, are influenced by the resist profile angle. That is, especially subsequent resist dry etching is likely to follow approximately the sidewall angle of the resist profile angle. Hence, variations in resist profile angles lead to process variations in subsequent steps, which are very undesirable. Again, the variation in the resist profile angle is a result of variations in feature size and packing density and hence has a similar general cause as does the above described edge location problem.

Prior art dose modulation methods (see M. Parikh, *Journal of Vacuum Science and Technology*, vol. 15, No. 3, pp. 931–933, May/June 1978) do not provide the benefits of the GHOST technique but do show less loss of modulation of the exposure density. With prior art dose modulation it is possible, albeit with large computational effort, to position feature edges at their intended locations. However, it is not possible to control the resist profile angles.

SUMMARY

In accordance with this disclosure, the above-described problems are addressed using dose conservation during pattern modification. Prior art, in an attempt to correct for proximity effects, modifies feature exposure doses or moves feature edges, thereby varying the energy scattered into neighboring features.

This undesirably results in complicated iterative calculations.

It also results in the above-described problem of variations in resist profile angle.

In accordance with this disclosure, the data which represents the features, and used by the lithography tool to control the actual exposure process, is modified such that the feature edge in question is corrected while neighboring features suffer little or no change. This decoupling is such that the proximity effect correction need not be iterated as in the prior art (see Parikh, cited above). This substantially reduces computational complexity and hence increases lithography throughput. Thus, the features are modified such that edge locations and resist profile angles are corrected while neighboring features suffer little or no change. This approach recognizes that the exposure energy density deposited in the resist controls not only the location of feature edges, but also the resist profile angle, and seeks in one embodiment to control the profile subject to holding feature edge locations constant.

More broadly, the present method includes estimating (predicting) where a developed feature edge will occur relative to a given feature edge; then modifying the feature in the vicinity of the given feature edge, using dose conservation, to compensate for the estimated misplacement of the developed edge. This modifying includes one of (1) defining a border of the feature and translating the boarder; or (2) defining a border of the feature and modulating the point-wise dose within the border; or (3) or translating the feature edge.

Note further that the feature border region vs. the central region of the feature has no special significance in terms of dimensions; in the extreme case, each border region is half the width of the feature and so the two border regions are the totality of the feature.

Thus the present method also includes stretching and shrinking the feature while maintaining constant dose-profile area or feature area X dose=dose volume. Thus it is contemplated to increase the dose in the border regions while compensatingly reducing dose in the central region of the feature. The dose-profile modifications can be continuous or discontinuous.

It is to be appreciated that in accordance with one embodiment, there is no attempt to correct for the resist edge profile angle, but only the edge location is controlled.

BRIEF DESCRIPTION OF THE DRAWINGS

FIG. 1b shows an energy density profile of the exposure pattern of FIG. 1a.

FIG. 3b shows an energy density profile corresponding to FIG. 3a.

The use of the same reference symbols in different drawings indicates similar or identical items.

DETAILED DESCRIPTION

Figure 2:
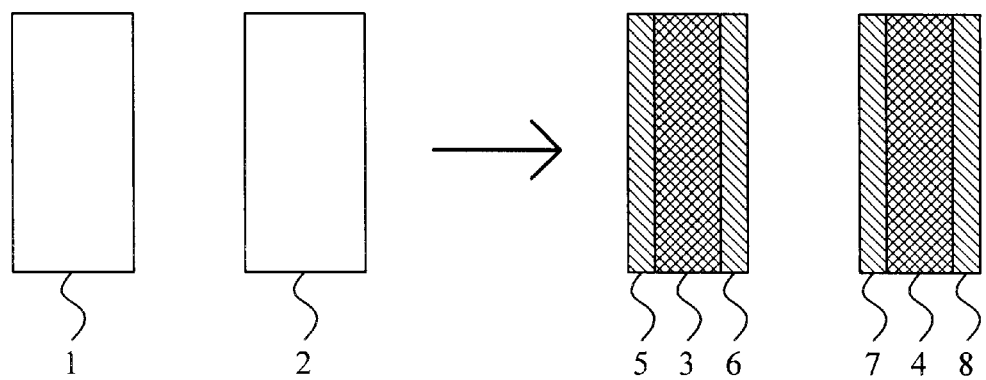
FIG. 2 shows, in the prior art, exposure of two adjacent features.

FIG. 2 shows, in the prior art, a plan view of two adjacent features 1 and 2 on a substrate. Features 1 and 2 are relatively close together so that there is some proximity effect due to electron and/or other energy scattering, as described above. In the prior art (see Kratschmer, *Journal of Vacuum Science and Technology*, vol. 19, No. 4, 1981, pp. 1264–1288), features 1 and 2 are typically imaged by beam scanning as shown in the right hand portion of FIG. 2 wherein each feature is partitioned into a central interior region and two border regions. In this case, feature 1 is partitioned into an interior region 3 with two border (edge) regions 5 and 6, and feature 2 is partitioned into an interior region 4 and two border regions 7 and 8. In this case, the area of regions 5 and 3 and 6 is in total the same as that of feature 1, and the area of regions 7 and 4 and 8 is in total the same as that of feature 2. FIG. 2 shows the image as it is to be exposed. This of course results in the problems described above in terms of proximity effect calculations.

The energy density deposited by an electron beam (or ion beam or laser beam) exposure can be considered to be composed of a narrow forward-scattered component and a broad backward-scattered component. This is more of a theoretical explanation than necessarily the physical reality, but is adequate for analytical purposes. This underlies the well known "two Gaussian" approximation to the exposure distribution used in conventional proximity effect correction. However, convolution of this distribution with a step function as happens at a feature edge results in a distribution which is the sum of two error functions.

Figure 3A:
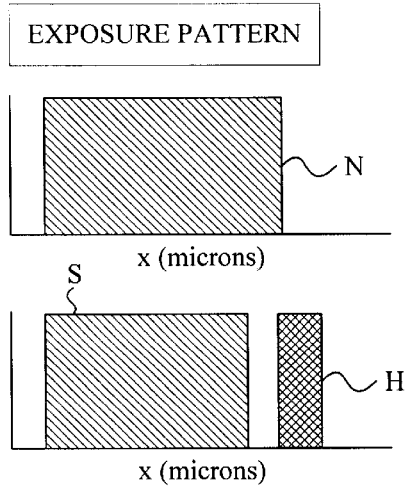
FIG. 3a shows an exposure pattern in accordance with the present disclosure.

Consider the nominal exposure step function N, as shown in the exposure pattern in the upper part of FIG. 3a, to be composed of another step function S and an adjacent narrow "top hat" function H, exposed by what is called here a "Dose-Conservative Border Modification" as shown in the lower part of FIG. 3a. It is clear that any perturbation of this top hat function H such that its area is conserved and it remains near the step S results in a stronger perturbation of the distribution near the step S than far away, where small changes are washed out due to the long range of the convolution. It is possible thus in accordance with the disclosure to move the developed location of an edge of a feature without particularly affecting the energy scattering into its neighboring features.

Figure 1A:
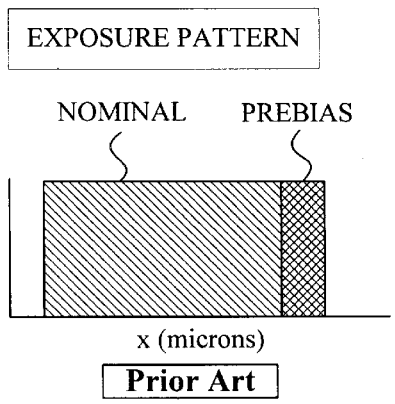
FIG. 1a shows a prior art exposure pattern.
Figure 1B:
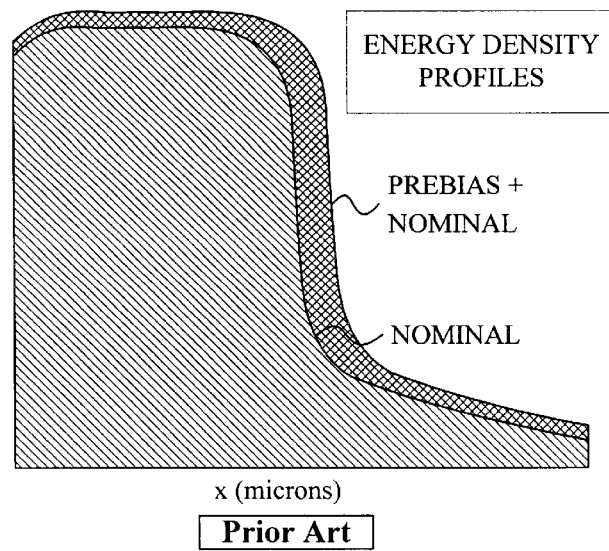
Figure 3B:
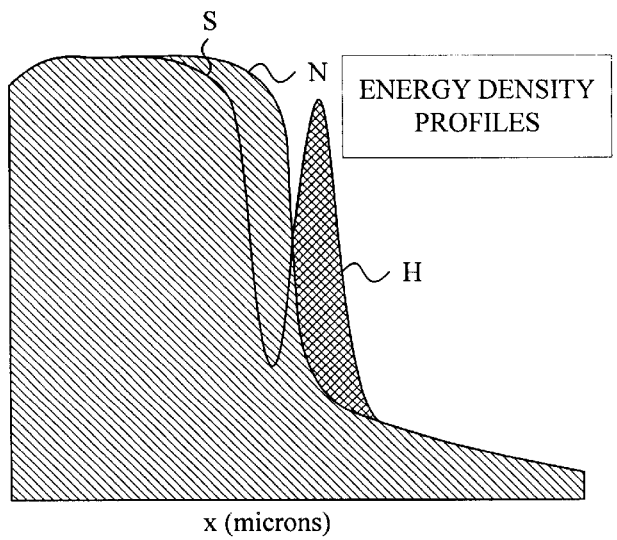

The associated energy density profiles for N, S. and H are graphed in FIG. 3b showing how what was the tail in prior art FIG. 1b now has a fairly unchanged height, indicating no interaction between the modifications of the instant feature with any nearby feature. The profile for S of FIG. 3a is the dark line partly interior to the gray area of the N (nominal) energy density profile.

In one embodiment, each feature in a lithography pattern is partitioned into an interior region and at least one border region. This is done for each edge of the feature so that depending on a number of edges, e.g., four for a rectangular shaped feature, there would be four border regions surrounding the interior region. See FIG. 4a where what was feature 1 of FIG. 2 is partitioned into border regions 5' and 6' and interior region 3. This is a modification of the right hand portion of FIG. 2 in the prior art since as can be seen now, border region 6' is spaced apart from associated interior region 3. (FIG. 4a, of course, shows the regions as exposed not as developed.) Thus, this partitioning takes place in the data processing portion of the lithography tool, prior to exposure.

At each feature edge, one must predict the local developed edge position. This is the position of the edge after exposure and development. There are a number of ways to perform this prediction. For one example, see Chen et al., *Journal of Vacuum Science and Technology*, B, Vol. 3, 1985, pp. 148–152, incorporated herein by reference in its entirety, which utilizes a parameter F which is computable from the applied exposure dose and which predicts local bias depending on other processing parameters such as the resist contrast value, the thickness of the resist, and the energy of the dose. Other such predictor techniques may also be used; see also, e.g., Pavkovich, European Patent Application 0 166549, 1986, incorporated herein by reference in its entirety. It is preferred that such predictive schemes are computed in advance for cases that are simply parameterized. One such simple parameterization would be total dose at a point or edge due to exposure throughout the pattern, excepting the point or edge in question.

Figure 4A:
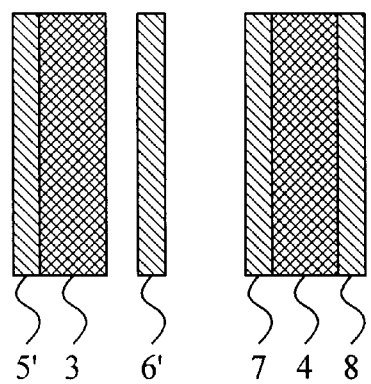
FIGS. 4a and 4b each shows two features in accordance with the present disclosure.

After making the prediction, the position of each border region, for instance 6' in FIG. 4a, is adjusted in terms of the pattern data to bring the developed edge location and the intended (nominal) edge location into coincidence. A priori, one does not know the sign of the displacement. FIG. 4a shows a displacement outward, referred to here as a positive displacement. This adjustment is constrained to hold the integrated dose, that is the total dose applied to region 6', constant compared to the nominal dose for region 6 in FIG. 2. In other words, the location of exposed region 6' in FIG. 4a is different from that of region 6 in FIG. 2, but the total exposure energy dose (computed as dose per area times area) remains the same. This is referred to as dose conservation. In some cases, a simple displacement of the location of border region 6 as exposed may suffice. It may be necessary in other cases to adjust the pointwise dose, while simultaneously adjusting the border region width. In any case, such adjustments will be simply (even monotonically) related to the actual adjustment of the developed edge and so are easy to compute.

Figure 4B:
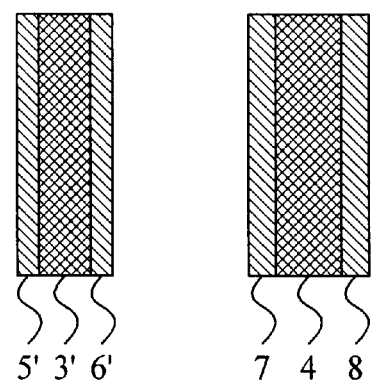

As an alternative to FIG. 4a, one may take the approach in FIG. 4b in which the exposed location of region 6 has been displaced leftwards (inward), a negative displacement, so that it overlaps with the interior region 3. The direction of the displacement will depend upon the sign of the needed adjustment. Displacements are believed to have the major influence on the position of the developed feature edge, while the dose intensity has the major influence on the profile angle of the developed resist. One may adjust both the border width and dose.

For purposes of simplicity, FIG. 4a shows only displacement of region 6' which is the right hand edge region due to the proximity of the adjacent feature. In an actual situation, typically there may be edge regions on all sides of interior region 3 and each of these may be subject to an adjustment of the type described herein.

Figure 1C:
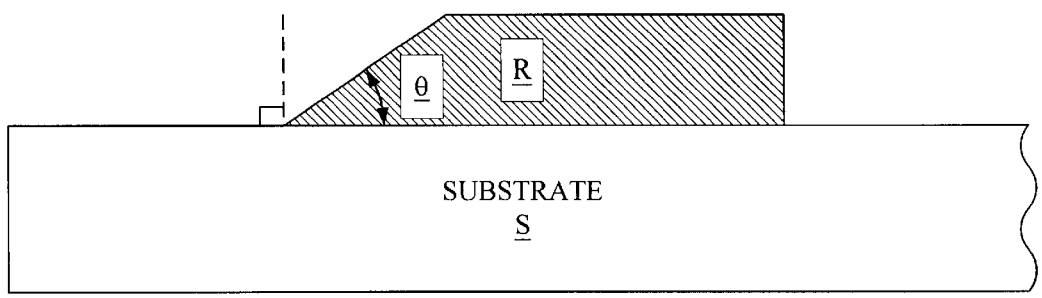
FIG. 1c shows a side view of a resist profile edge.
Figure 5:
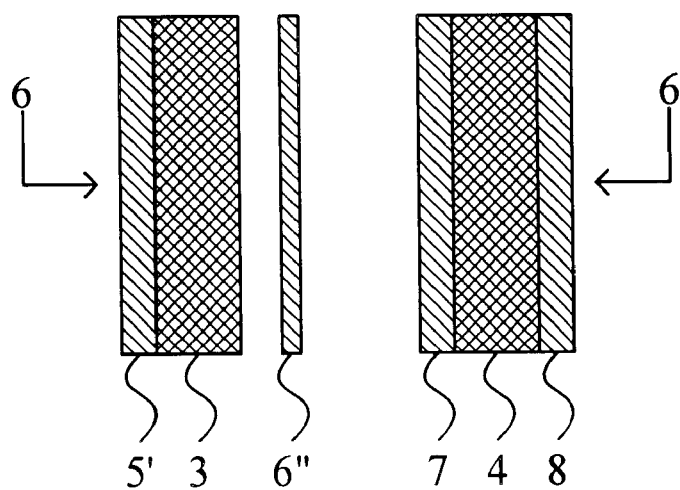
FIG. 5 shows the features in accordance of the present disclosure exposed to control for resist profile angle.
Figure 6:
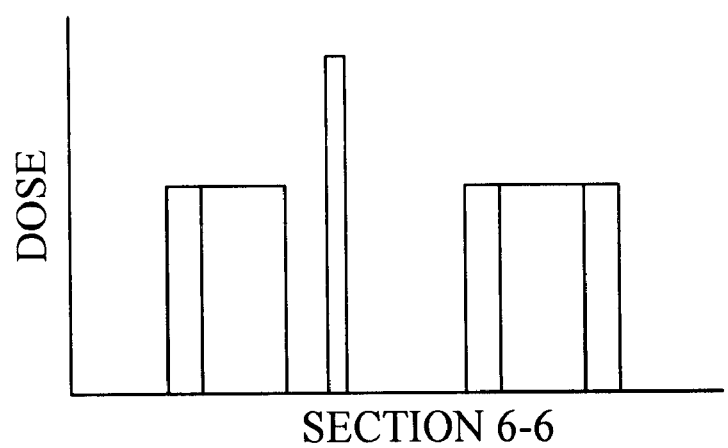
FIG. 6 shows a graph of dose intensity corresponding to the features of FIG. 5.

The issue of resist profile angles was discussed above in combination with FIG. 1c. In accordance with another aspect of this disclosure, one can achieve uniform resist profile angles over a particular workpiece in spite of feature packing density (proximity) variations. This is illustrated in FIG. 5 showing two features (as exposed) corresponding to features 1 and 2 of FIG. 2 and looking much like FIG. 4a. That is, in this case, the right edge region 6" is spaced apart from the associated interior region 3. However, there is a difference here compared to FIG. 4a. This is illustrated in FIG. 6 which shows graphically the actual dose intensities through cross-section AA of FIG. 5. Region 6" has a much higher dose intensity than the other regions. However, region 6" is also narrower than is region 6' in FIG. 4a. There is dose conservation in terms of the total dose integrated over the area of region 6"; the exposed region 6" is smaller in area than region 6', with a higher exposure dose per unit area. Hence, this is a further modification of the approach described above in conjunction with FIGS. 4a and 4b.

In this case at each design (nominal) feature edge, one predicts the local developed edge profile (resist angle) within the specified tolerance determined by other process parameters. This adjustment is constrained by keeping the integrated dose in the border region 6" the same as the nominal dose. Adjustment of the pointwise border dose, while simultaneously adjusting the border width, may suffice. In any case, such adjustments are simply (even monotonically) related to the actual adjustment of the developed resist profile angle and so are relatively easy to compute.

This resist profile angle approach has been found to be most efficacious with so-called lower contrast resist. Contrast is a well known parameter describing particular resist/developer systems (combinations). Contrast is a function of the remaining resist thickness versus the exposing dose. The proximity effects here are also dependent on beam voltage and resist thickness. The problems addressed in accordance with this disclosure (especially resist profile angle) are especially present at relatively low beam energies, for instance 10V kilovolt or less for an electron beam, since then there is a greater energy density gradient from top to bottom of the resist layer. (Note that in this case, contrary to intuition, there is actually more exposure at the bottom of the resist layer than at the top since the electrons slow down and transfer energy more effectively as they penetrate the resist layer.)

Note that the above described process for obtaining a uniform resist profile angle is used (in one embodiment) in conjunction with conventional proximity effect correction (for feature edge placement control), provided this process is applied to the data after the proximity effect correction is made to the data. Data here refers to the representation of the features, conventionally used in the data processing portion of a lithography tool. Note that in the FIG. 5 embodiment, similar to FIGS. 4a and 4b, the goal is to achieve an exposed and developed feature having the nominal (design) edge locations irrespective of localized packing density of neighboring features. That is, the goal is to have the post-developed resist edge in a fixed (design or nominal) position. Also, the resist profile approach shown in FIG. 5 is intended to achieve a uniform resist profile angle across the entire workpiece, in spite of any localized packing density (proximity) effects. Note that the border region in some embodiments is broadened (rather than narrowed) to better control the resist profile angle.

In yet another embodiment, the proximity effect correction is made using the method described above in conjunction with FIGS. 3a, 3b and 4a, 4b. Then the resist profile angle is performed using the method described above in conjunction with FIGS. 5 and 6. This sequence is followed because generally proximity effect correction would not preserve resist profile angles.

It is to be understood that, as described above, there is no dimensional distinction between a feature border region and the feature interior region, and the above methods may be performed on the entire feature. Hence, these methods are readily applied to stretch and shrink the feature while maintaining a constant dose-profile area. Also the dose applied to the border regions of a feature may be increased while compensatingly reducing the dose applied to the feature interior region.

The above-described methods are typically practiced in conjunction with a largely conventional lithography tool of the type well known as a laser pattern generator. See U.S. Pat. No. 4,797,696 issued to Allen et al. Jan. 10, 1989 and U.S. Pat. No. 4,796,038 issued to Allen et al. Jan. 3, 1989, both incorporated herein by reference in their entireties or an electron beam lithography tool used for a raster or vector scanning, for example, of the MEBES type, see U.S. Pat. No. 3,900,737 issued to Collier et al., Aug. 19, 1975, incorporated herein by reference in its entirety. Equipment of both types is commercially available from Etec Systems, Inc., Hayward, Calif.

The relevant modifications to the lithography tool in either case are in the pattern processing software and/or in the data path (data processing circuitry). Carrying out such modifications would be well within the skill of one of ordinary skill in the art in light of this disclosure.

Figure 7:
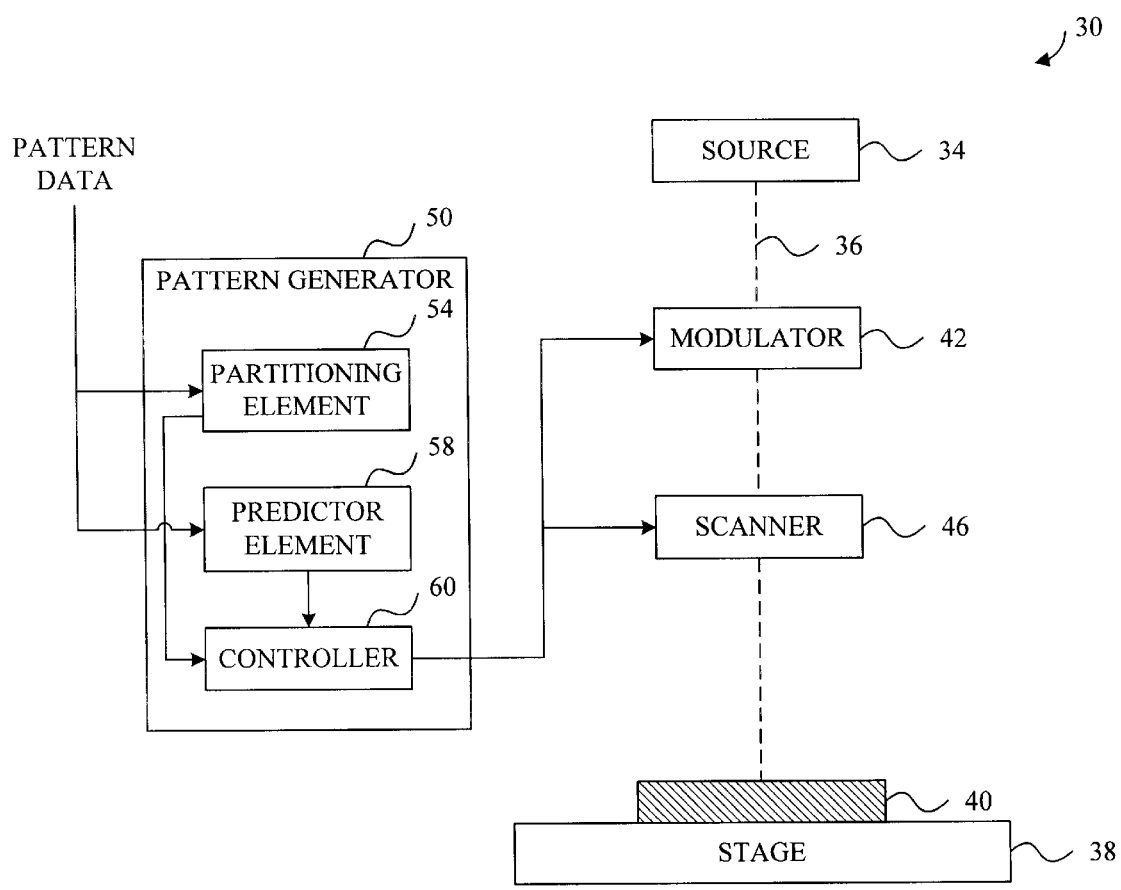
FIG. 7 shows a block diagram of a lithography tool in accordance with this disclosure.

Such a beam scanning lithography tool 30 suitable for carrying out processes in accordance with this disclosure is illustrated in FIG. 7. This lithography tool 30 is generic to a scanned electron beam, ion beam, or a scanned laser beam pattern generator type and includes conventionally a source 34 of the exposing beam 36 which is either a laser or an electron (charged particle) source. The associated conventional elements such as focusing optics are not shown. Also included is a support 38 for the workpiece 40; support 38 is typically an X-Y stage. Of course, in the case of an electron beam lithography tool, the electron beam is housed within an electron beam column (in a vacuum). This is not shown. In either case, a modulator 42 modulates the intensity of the beam 36 and a scanner 46 scans the beam 36 across the workpiece 40. In the case of the laser pattern generator, the scanner 46 typically includes a rotating reflective polygon; in the case of the electron beam tool, the scanner 46 is a set of deflector electrodes or magnetic coils. This beam deflection is performed in conjunction with translation of the workpiece by the stage 38.

The associated pattern generator 50 performs the data processing and carries out the operative portions of the processes described above. The pattern generator 50 includes a partitioning element 54 that receives the nominal (design) pattern data in conventional form, representing the features to be exposed. The partitioning element 54 performs the feature (border/edge) partitioning illustrated above. A predictor element 58 performs the predictions as to the locations of the developed feature edges in view of proximity effects. This carries out prediction algorithms of the type described above. This prediction may be performed off-line. A controller 60 coupled to both the partitioning element 54 and the predictor 58 determines the exposure location of each of the border regions and their doses as described above.

It is understood that the key elements here, which are in the pattern generator 50, may take a number of forms and be various combinations of circuitry and software. The software may be executed by a special purpose processor or by a more general purpose computer.

This disclosure is illustrative but not limiting; further modifications will be apparent to one skilled in the art in light of this disclosure and are intended to fall within the scope of the appended claims.

We claim:

1. A method of exposing features on a sensitive layer comprising the acts of:
    partitioning each of the features into at least one interior region and at least one border region at a nominal location;
    predicting a location of each edge of each feature on the sensitive layer after the sensitive layer is exposed and developed including scattering effects;
    determining a nominal total exposure dose of at least a portion of each feature; and
    exposing the sensitive layer to a modulated energy beam to which the sensitive layer is sensitive, taking into account the nominal total exposure dose determined, wherein for each feature the at least one border region is exposed at a location on the sensitive layer translated relative to its nominal location.

2. The method of claim 1, wherein the modulated energy beam is one of a charged particle beam or a laser beam.

3. The method of claim 1, wherein each feature is rectangular in shape and has one interior region and at least two border regions.

4. The method of claim 1, wherein for each feature, an area of the feature in the act of partitioning is equal to a total area of the exposed interior region and border regions.

5. The method of claim 1, wherein in the act of exposing, for each location the at least one exposed border region is translated relative to the associated exposed interior region.

6. The method of claim 1, wherein in the act of exposing, for each feature a modulated intensity of the energy beam per unit area of the at least one border region is different than a modulated intensity per unit area of the associated interior region.

7. The method of claim 6, wherein for the at least one border region, its exposed area is different than its area as determined in the act of partitioning.

8. The method of claim 7, wherein for the at least one border region, its total exposure is equal to its nominal total exposure.

9. The method of claim 7, wherein either (a) the modulated intensity of the energy beam per unit area of the at least one border region is greater than that of the associated interior region and the exposed area is less than its area as determined; or (b) the modulated intensity of the energy beam per unit area of the at least one border region is less than that of the associated interior region and the exposed area is greater than its area as determined.

10. The method of claim 1, wherein the act of predicting uses parameters including a modulated intensity of the energy beam, a contrast value of the sensitive layer, and a thickness of the sensitive layer.

11. The method of claim 1, further comprising the act of proximity error correcting the feature before the act of partitioning.

12. A method of exposing features on a sensitive layer comprising the acts of:
    predicting a location of each edge of each of the features on the sensitive layer after the sensitive layer is exposed and developed including scattering effects;
    determining a nominal total exposure dose of at least a portion of each feature;
    modifying a definition of the feature to compensate for the predicted location of each edge; and
    exposing the sensitive layer to a modulated energy beam to which the sensitive layer is sensitive according to the modified definition of the feature, wherein the act of modifying includes at least one of:
        a) defining a border region of each feature contiguous to each of its edges and translating the border region relative to its nominal location;
        b) defining a border region of each feature continuous to each of its edges and determining an exposure dose within the border region; and
        c) translating each edge relative to its nominal location.

13. The method of claim 12, wherein the modulated energy beam is one of a charged particle beam and a laser beam.

14. The method of claim 12, wherein at least one feature is rectangular in shape and the defining defines one interior region and at least two border regions.

15. The method of claim 12, wherein the predicting uses parameters including a modulated intensity of the energy beam, a contrast value of the sensitive layer, and a thickness of the sensitive layer.

16. The method of claim 12, further comprising proximity error correcting the feature before the defining.

* * * * *